United States Patent
Savelli et al.

(10) Patent No.: US 10,205,083 B2
(45) Date of Patent: Feb. 12, 2019

(54) DEVICE WITH DEFORMABLE SHELL INCLUDING AN INTERNAL PIEZOELECTRIC CIRCUIT

(71) Applicant: Commissariat A L'Energie Atomique Et Aux Energies Alternatives, Paris (FR)

(72) Inventors: Guillaume Savelli, Grenoble (FR); Philippe Coronel, Barraux (FR)

(73) Assignee: Commissariat A L'Energie Atomique Et Aux Energies Alternatives, Paris (FR)

(*) Notice: Subject to any disclaimer, the term of this patent is extended or adjusted under 35 U.S.C. 154(b) by 546 days.

(21) Appl. No.: 14/953,621

(22) Filed: Nov. 30, 2015

(65) Prior Publication Data

US 2016/0155928 A1    Jun. 2, 2016

(30) Foreign Application Priority Data

Dec. 1, 2014   (FR) .................................... 14 61701

(51) Int. Cl.
*H01L 41/113* (2006.01)
*H02N 2/18* (2006.01)
(Continued)

(52) U.S. Cl.
CPC .......... *H01L 41/1132* (2013.01); *A63B 39/00* (2013.01); *A63B 43/00* (2013.01);
(Continued)

(58) Field of Classification Search
CPC . H01L 41/1132; H01L 41/1138; A63B 39/00; A63B 43/00; H02N 2/18; H02N 2/181; H02N 2/186
(Continued)

(56) References Cited

U.S. PATENT DOCUMENTS 9,724,570 B2 *  8/2017  Krysiak ................. A63B 43/06
2002/0173378 A1 * 11/2002  Tinsman ............ A63B 24/0021
                                                             473/351
(Continued)

FOREIGN PATENT DOCUMENTS

| CN | 101719736 A | 6/2010 | |
| DE | 10008325 A1 * | 8/2001 | ............ G01M 19/00 |
| EP | 2 364 752 A1 | 9/2011 | |

OTHER PUBLICATIONS

French Search Report (Application No. 14.61701) dated Jul. 23, 2015.

*Primary Examiner* — Thomas Dougherty
(74) *Attorney, Agent, or Firm* — Burr & Brown, PLLC

(57) ABSTRACT

A device is provided, including a deformable shell defining an inner space including at least one piezoelectric system. The piezoelectric system includes a flexible piezoelectric membrane capable of generating electric energy under the effect of a deformation to which it is submitted, a rechargeable electric power source, formed on a flexible substrate, and an electronic circuit. The electronic circuit includes a processing circuit for generating and storing data according to the electric energy generated by the piezoelectric membrane, and connected to the electric power source for its electric power supply, and a wireless transmitter connected to the processing circuit to transmit the data stored therein and connected to the electric power source for its electric power supply. Each piezoelectric system is totally arranged on and/or inside of the deformable shell.

12 Claims, 3 Drawing Sheets

(51) Int. Cl.
*A63B 39/00* (2006.01)
*A63B 43/00* (2006.01)

(52) U.S. Cl.
CPC ........... *H01L 41/1138* (2013.01); *H02N 2/18* (2013.01); *H02N 2/181* (2013.01); *H02N 2/186* (2013.01)

(58) Field of Classification Search
USPC ................................ 310/319, 339, 367, 371
See application file for complete search history.

(56) References Cited

U.S. PATENT DOCUMENTS

| | | | |
|---|---|---|---|
| 2007/0167247 A1* | 7/2007 | Lindsay | A63B 24/0021 473/131 |
| 2010/0043541 A1* | 2/2010 | Kobayakawa | B60C 23/0411 73/146 |
| 2010/0090477 A1 | 4/2010 | Keating et al. | |
| 2011/0118064 A1* | 5/2011 | Krysiak | A63B 41/02 473/603 |
| 2011/0136603 A1 | 6/2011 | Lin et al. | |
| 2013/0073248 A1* | 3/2013 | Perkins | G01C 19/56 702/141 |
| 2013/0167290 A1* | 7/2013 | Ben Ezra | A63B 71/10 2/425 |
| 2014/0222177 A1* | 8/2014 | Thurman | G09B 19/0038 700/92 |
| 2014/0235379 A1* | 8/2014 | Nurnberg | A63B 43/004 473/570 |
| 2016/0236043 A1* | 8/2016 | Savelli | A63B 39/00 |
| 2017/0239530 A1* | 8/2017 | Savelli | A63B 43/004 |

\* cited by examiner

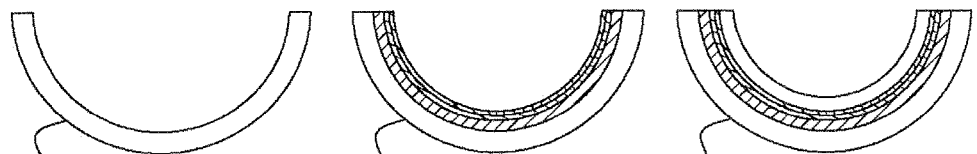
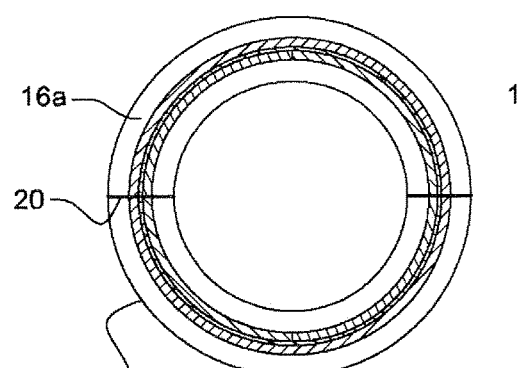
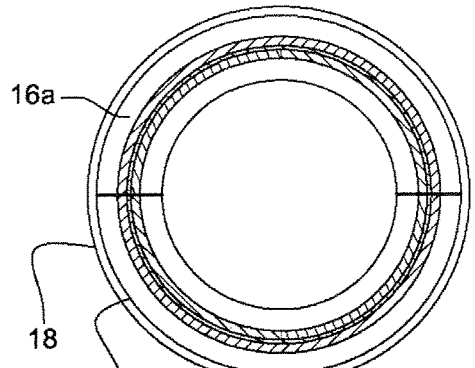
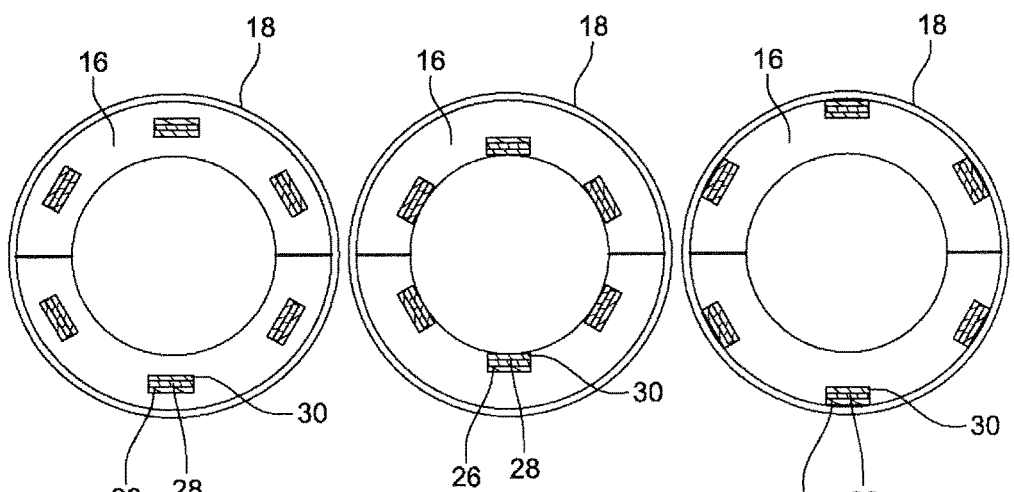

DEVICE WITH DEFORMABLE SHELL INCLUDING AN INTERNAL PIEZOELECTRIC CIRCUIT

BACKGROUND OF THE INVENTION

1. Field of the Invention

The invention relates to the functionalization of balls, particularly deformable balls, especially in the field of sports and/or of physical rehabilitation and/or of leisure. The invention particularly applies to tennis balls.

2. Description of Related Art

In ball sports and physical restoration based on such objects, it is useful to have statistics enabling players to analyze their game and medical staff to assess the quality of the exercises practiced by the patients. Usually, such statistics are manually collected by, for example, counting the number of shots, bounces, or others applied by a player or a patient on a ball for a determined time period.

It is also advantageous to integrate in balls electronic functions enabling to automatically make statistics and/or to convert and store the mechanical energy provided to these objects during the use thereof into electric energy.

Document US 2011/136603 discloses a sports ball comprising a deformable shell defining an inner space under pressure, such as for example a tennis ball, and comprising a piezoelectric element arranged on or inside of the deformable shell to convert the mechanical energy corresponding to the shell deformation into electric energy, and an electronic circuit comprising a battery for storing the electric energy thus generated and a processing circuit powered with the battery, such as for example an accelerometer, a pressure sensor, or a GPS.

This document is however mute as to the way of integrating these different components in the ball. Now, this integration generally aims at a plurality of objects, which may be contradictory.

First, a high rate of conversion of mechanical energy into electric energy is desired, since the electric energy may be used to power electronic circuits requiring a high energy level to operate.

Then, the components integrated in the ball should provide a minimum hindrance to the aerodynamic properties and the deformations thereof, since a functionalized ball having mechanical characteristics close to and ideally identical to those of a conventional ball in order to be used instead of it is desired, particularly in sports, where balls must satisfy very strict criteria to be deemed compliant.

Finally, it is preferable for the components to be mechanically robust to face mechanical stress which may be high due to the shocks and significant accelerations undergone by the ball. The inventors have further noted, in the context of trials on different types of electronic circuit and of electronic connections integrated in a tennis ball, frequent breakages of these components.

SUMMARY OF THE INVENTION

The present invention aims at providing a device with a deformable shell defining an internal space which comprises circuits generating electricity under the effect of deformations of the shell and using said electricity generation for processing and/or storage purposes, which has a mechanical behavior close to that of a device comprising no such circuits, and having circuits which are robust while providing a high rate of conversion of mechanical energy into electric energy.

To achieve this, the invention aims at a device comprising a deformable shell defining an inner space comprising at least one piezoelectric system, said system comprising:
- a flexible piezoelectric membrane capable of generating electric energy under the effect of a deformation to which it is submitted;
- a rechargeable electric power source, formed on a flexible substrate;
- an electronic circuit comprising:
  - a conversion circuit connected to the piezoelectric membrane to convert the electric energy generated by said membrane into electric energy capable of being used to recharge the electric power source, and connected to the electric power source to recharge it with the converted electric energy;
  - a processing circuit for generating and storing data according to the electric energy generated by the piezoelectric membrane, and connected to the electric power source for its electric power supply; and
  - a wireless transmitter connected to the processing circuit to transmit the data stored therein and connected to the electric power source for its electric power supply, in which device each piezoelectric system is totally arranged on and/or inside of the deformable shell.

"Deformable" here means a shell capable of deforming under the effect of impacts to which it is submitted during a standard use of the shell.

In other words, there is no element in the inner space, and no element crossing the deformable shell. All the elements of the piezoelectric system are integrated inside of or on the shell which defines the surfaces of a ball, particularly on the inner surface of the shell, inside of the shell or on the external shell wall. Thus, the addition of the elements of the piezoelectric system only very marginally influences the trajectory and deformation of the shell constitutive of a ball or has no influence thereon. Further, the total weight of the device may be adapted to be within an official weight range, for example, to be respected by a ball, by for example decreasing the weight of the added elements and/or by modifying the shell weight.

According to an embodiment of the invention, the device has one or a plurality of the following features:
- the piezoelectric system is band-shaped, said band being secured to the outer surface of the deformable shell or secured to the inner surface of the deformable shell or housed in the deformable shell;
- the band is substantially homogeneous by weight lengthwise and widthwise;
- the band is fastened to a holding band glued on a wall of the deformable shell, said holding band being detachable;
- the electric power source and the electronic circuit are each arranged on the piezoelectric membrane;
- the electric power source and the electronic circuit substantially exactly cover the piezoelectric membrane;
- the thickness of the electric power source and the thickness of the electronic circuit are substantially equal;
- the piezoelectric membrane, the electric power source, and the electronic circuit are stacked on one another, the electric power source being arranged between the piezo-electric membrane and the electronic circuit;
- the electric power source is rechargeable, and the electronic circuit comprises a conversion circuit connected to the piezoelectric membrane to convert the electric energy generated by said membrane into electric energy capable of being used to recharge the electric power source, and connected to the electric power source to recharge it with the converted electric energy;

the device comprises a plurality of identical piezoelectric systems;

the shell exhibits at least one symmetry, and the piezoelectric systems are distributed in and/on the shell in accordance with the symmetry thereof;

the wireless transmitter is a radio frequency transmitter;

the shell is a tennis ball comprising a rubber shell, each piezoelectric system being totally arranged inside of and/or on the rubber shell.

BRIEF DESCRIPTION OF THE DRAWINGS

The invention will be better understood on reading of the following description provided as an example only in relation with the accompanying drawings, where:

FIGS. 7A to 7E are simplified cross-section views illustrating the integration of piezoelectric systems according to the invention in each of the half-shells of a tennis ball; and FIGS. 8A to 8C are simplified cross-section views illustrating piezoelectric systems according to the invention duplicated inside, outside, or in the half-shells of a tennis ball.

DETAILED DESCRIPTION OF THE INVENTION

Figure 1:
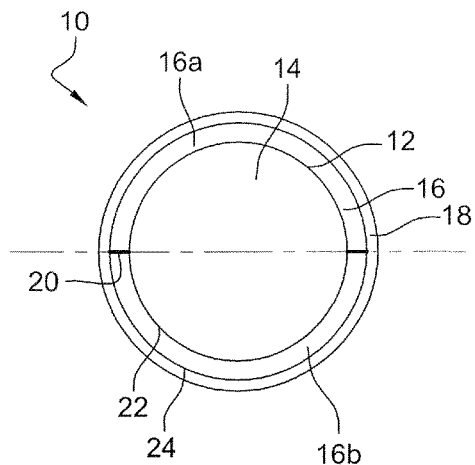
FIG. 1 is a simplified cross-section view of a tennis ball of the state of the art.

Referring to FIG. 1, a tennis ball 10 of the state of the art comprises a deformable spherical shell 12 defining a hollow inner space 14. Shell 12 is for example formed of a rubber layer 16 covered with an external felt layer 18 and inner space 14 comprises air under a pressure greater than the atmospheric pressure, particularly a pressure in the order of 2 bars. Tennis ball 10 has a diameter between 6.5 cm and 6.9 cm, and a mass between 56 grams and 59 grams. To manufacture ball 10, two identical spherical rubber half-shells 16a, 16b are first manufactured, after which the two half-shells 16a, 16b are fastened to each other by means of glue 20. Once the glue has dried, shell 16 is placed in a drum filled with glue so that it is coated therewith, and felt 18, previously cut, is then laid on the outer surface of rubber shell 16.

Figure 2:
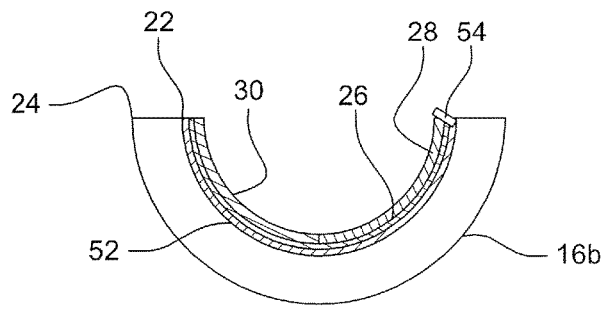
FIG. 2 is a simplified cross-section view of a half-shell of a tennis ball integrating a piezoelectric system according to the invention.

According to the invention, one or a plurality of piezoelectric systems for converting mechanical energy into electric energy, to generate and transmit statistic data, are totally integrated in shell 16, and/or on its inner surface 22, and/or on its outer surface 24. Referring, for example, to FIG. 2, such a system, fastened to the inner surface of one of the half-shells of the tennis ball comprises:

a piezoelectric membrane 26 capable of generating a voltage under the effect of the deformation to which it is submitted, and comprising two electrodes (not shown) for collecting the generated voltage;

a rechargeable electric power source 28 comprising two terminals for its recharge and the electric power supply of circuits connected thereto; and an electronic circuit 30 electrically connected across piezoelectric membrane 26 and electric power source 28.

More particularly, electronic circuit 30 comprises:

a conversion circuit connected to piezoelectric membrane 26 to convert the voltage that it generates, by definition having a variable duration and amplitude, into an electric voltage capable of being used to recharge electric power source 28. Particularly, the conversion circuit comprises an AC/DC converter which rectifies and smoothes the variable voltage generated by piezoelectric membrane 26, and applies the rectified and smoothed voltage across electric power source 28;

a circuit for processing the voltage generated by piezoelectric membrane 26, for example, to create statistics of the shots on the tennis ball. The processing circuit thus generates data that it stores in an internal digital memory. The processing circuit is further connected across electric power source 28 for its electric power supply; and a wireless transmitter, particularly a radio frequency transmitter, connected across electric power source 28 for its electric power supply. Particularly, the transmitter is connected to the processing circuit to transmit the data stored therein.

In particular, each time the ball is submitted to an impact, for example, a shot or a bounce, piezoelectric membrane 28 generates a corresponding voltage pulse having its amplitude and its duration depending on the characteristics of the impact. The processing circuit may for example implement a function of counting the number of pulses generated since the tennis ball has been put into service, a function of determining the average or individual intensity of the pulses, and/or a function of determining the average or individual duration of the pulses. The processing circuit may comprise other functionalities, such as for example an accelerometer enabling to determine the ball speed.

Particularly, knowing the number of pulses enables to know, in addition to the number of impacts undergone by the ball, the wearing state thereof, since this wearing state particularly directly depends on this number. The number of impacts, their intensity, and their duration further form statistic data useful for a player who can thus know the strength of his/her shots and the type of shots that he/she applies to the ball, etc. It has in particular been observed that there exists a bijective relation between the amplitude of the first pulse following an impact on the ball and the force of this impact. The processing circuit for example comprises a chart storing force values according to the voltage amplitude and calculates the force exerted on the ball according to the amplitudes of stored voltages, or stores the amplitude of the pulse, the calculation being performed by an external computer system once the amplitude data have been transmitted by the radio frequency transmitter and captured by the computer system which comprises a radio frequency receiver.

The radio frequency transmitter of the electronic circuit may further transmit a radio frequency signal at regular intervals and/or substantially continuously. Such a transmission enables, once the signal has been received and processed by a receive system, to locate the ball on a tennis field, which for example enables to know whether a ball is in or out.

Advantageously, the elements of the piezoelectric system are selected to modify at least the resilience of the shell of the tennis ball and the aerodynamic properties thereof. Particularly, a maximum number of system elements are selected to be flexible, and thus deformable and capable of following the deformations of the tennis ball.

Figure 3:
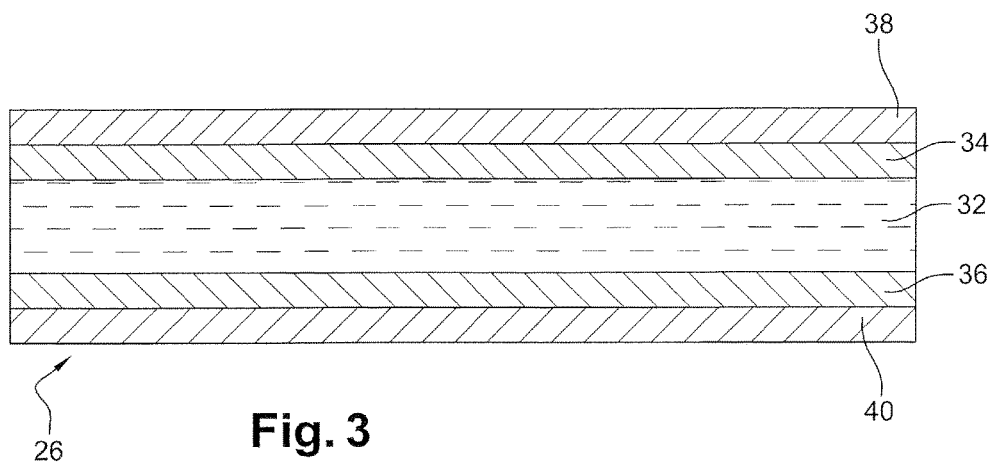
FIG. 3 is a simplified cross-section view of a piezoelectric membrane constitutive of the system of FIG. 2.

More particularly, piezoelectric membrane 26 is flexible. Referring to FIG. 3, piezo-electric membrane 26 for example comprises:

- a piezoelectric film 32, having a thickness advantageously in the range from 10 micrometers to 200 micrometers, formed in one piece or in a plurality of pieces.
- two metal layers 34, 36, having a thickness in the range from a few nanometers to a few tens of micrometers each, deposited on either side of piezoelectric film 32, for example, made of silver, of copper nitride, of aluminum, and forming two electrodes for collecting the electric charges generated by film 32;
- optionally two flexible reinforcement layers 38, 40, for example, made of plastic, such as polyethylene terephthalate ("PET") or of polyethylene naphthalate ("PEN"), respectively deposited on electrodes 34, 36.

Advantageously, piezoelectric film 32 is made of polyvinylidene fluoride ("PVDF") which has the advantage of being at the same time light, flexible, and mechanically resistant. As a variation, film 36 is made of lead titanium zirconate ("PZT"), of zinc oxide ("ZnO"), or of a composite material made of at least two materials among these and PVDF. For example, the piezoelectric membranes are "DT sensors" manufactured by Measurement Specialities, Inc.

Electric power source 28 is a microcell, a microbattery, a supercapacitor, preferably formed on a flexible substrate. For example, the flexible substrate microbattery source of Solicore®, Inc., for example, a microbattery bearing reference "SF-2529-14EC" having a foldable surface area of 25.75×29 $mm^2$ for a 14-mAh capacitance.

Electronic circuit 30 is particularly formed of a microcontroller enabling to process input data, of a unit allowing a radio frequency transmission, of decoupling capacitors, of filtering coils and capacitor, of an ADC converter, and of a circuit with an operational amplifier (inverter, subtractor, etc.).

Electronic circuit 30 is preferably also formed or placed onto a flexible substrate. Since the functions implemented by electronic circuit 30 do not require a high calculation power and a large computer memory, a circuit 30 is for example formed according to the LGA technology (acronym for "Land Grid Array") or to any similar technique allowing a high rate of integration per surface area unit. A circuit 30 having a highly decreased weight and dimensions is thus obtained. For example, a radio frequency transmitter according to this technology is a cuboid having a surface area equal to 5.5×5.5 $mm^2$ for a thickness smaller than one millimeter. As a variation, circuit 30 is a circuit also known as "flex PCB" or "flex circuit".

Different embodiments for the integration of the piezoelectric system which has just been described into and/or on shell 16 of the tennis ball are now described.

Referring again to FIG. 2, a first embodiment comprises fastening the system which has just been described on inner surface 22 of one of half-shells 16b before gluing the two half-shells 16a, 16b of tennis ball 10. More particularly, the piezoelectric system is designed in the form of a band, preferably having a substantially constant thickness and/or a substantially homogeneous weight according to the length and the width of the band and/or a surface area substantially equal to that of inner surface 22 of half-shell 16b. To achieve this, power source 28 and electronic circuit 30 are for example fastened, for example by gluing, to piezoelectric membrane 26, the latter being partially or exactly covered with the electronic circuit and the power source.

In a preferred variation, the band-shaped system is itself glued to a holding band 52, and the holding band is fastened to inner surface 22 of half-shell 16a with a "reversible" adhesive, that is, an adhesive (glue, gel . . . ) enabling an operator to detach the holding band without tearing the band. For example, the adhesive is a two-faced scotch tape or a self-healing tape. Holding band 52, for example, a two-faced scotch tape, allows both an easy and resistant installation, and also an easy and fast removal. Preferably, the holding band comprises a tab 54, not glued to half-shell 16b, and thus free of being grabbed by an operator, to ease the detaching of holding band 52, and accordingly of the piezoelectric system. Thereby, the system may be recycled. Indeed, the wearing of a tennis ball, for example, is very fast, much faster than the discharge of the power supply integrated in the ball. To make such functionalized balls profitable, a reusable "all in one" system is thus provided.

The components of the piezoelectric system are thus electrically interconnected by electric conductive wires which are the shortest and the thinnest possible. Elements such as the RF transmitter and/or other components of the electronic circuit and/or the power source may also be deposited and electrically connected on a flexible substrate with printed metal tracks directly above (PCB with flexible substrate). In this case, flexible PCB may also be directly used as a holding band and may directly be glued on the ball.

Of course, the layout of the elements provided in FIG. 3 is only a possibility: the distribution and the accurate positioning of the technological elements on the holding element depend on their exact mass, on their number (for example, 1 or 2 microbatteries), on their exact surface area (dimension of the microbattery according to its charge capacity, for example, etc.), the aim being, in the end, to obtain as homogeneous a mass distribution as possible on the ball surface.

Advantageously, a second piezoelectric system, identical to that which has been described, is attached to the inner surface of the other half-shell of the tennis ball. This allows both a redundancy function, the functionalized tennis ball keeping on operating if one the systems is defective, and a better weight distribution, and thus enables to have aerodynamic properties only slightly modified with respect to a tennis ball of the state of the art.

Figure 4:
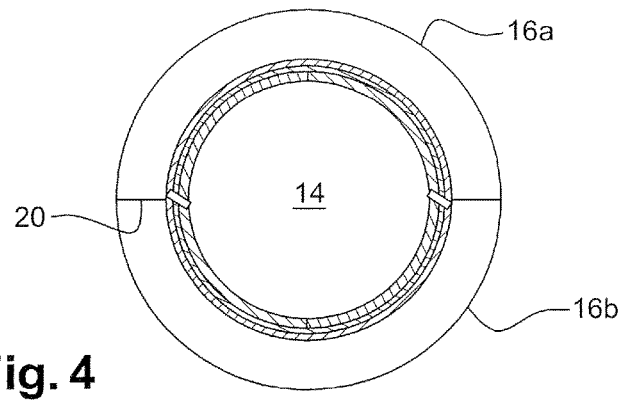
FIG. 4 is a simplified cross-section view of a tennis ball integrating two recyclable piezoelectric systems according to the invention.

The integration of piezoelectric system according to the invention is particularly easy, the manufacturing of a tennis ball according to the first embodiment comprising:

1. forming the two rubber half-shells according to the method of the state of the art;
2. arranging the functional band containing a piezoelectric system on each half-shell, as illustrated in FIG. 2;
3. gluing the two rubber half-shells according to the method of the state of the art, thus obtaining a functionalized shell such as illustrated in FIG. 4; and
4. arranging the felt on the shell according to the method of the state of the art.

The recycling of the piezoelectric systems is also easily performed and for example comprises:

1. cutting the ball at the exact location of the gluing of the two half-shells, this location being advantageously marked on the felt on manufacturing of the ball, for example, by means of ink;
2. removing the two functional bands by pulling the corresponding tabs;
3. recycling the two half-balls, for example with the recycling program established by certain Tennis associations, such as the French Federation;
4. the two functional bands are thus reusable, the power source being advantageously recharged before being incorporated into a new tennis ball.

The embodiment allowing the recycling induces an additional cost since the ball recycling has to be managed. According to a second embodiment, the piezoelectric system(s) integrated in the tennis ball are not recyclable. In addition to the cost decrease, this embodiment has the advantage of doing away with holding bands, which add additional mass to the ball mass. Doing away with these bands enables to release ball weight constraints, which constraints are particularly strict for tennis balls.

This embodiment is identical to that of FIGS. 2 and 4, except for holding elements 52, 54 which are omitted, the piezoelectric systems being directly glued to the tennis ball shell.

For the first and the second embodiment, a removal of rubber mass, for example, the removal of a layer of the rubber shell, may be performed. This removal may be performed on manufacturing of the half-shells or on integration of the piezoelectric systems, for example, by cutting or burning with a mould. This enables not to modify the total mass of the ball with respect to the ball of the state of the art and thus provides more liberty for electronic components.

The two embodiments relate to an integration of the piezoelectric systems on inner surface 22 of shell 16 of the tennis ball.

According to a third embodiment, the piezoelectric system(s) are fastened to outer surface 24 of shell 16 of the tennis ball. This embodiment is similar to the first two and differs therefrom by the fact that with or without recycling, the integration of the functional bands is performed after the step of gluing the 2 rubber half-shells, and before the felt gluing step. Adding the latter enables to mechanically protect the elements of the piezoelectric system fastened to the outer surface of the ball shell.

Figures 5A, 5B, 5C:
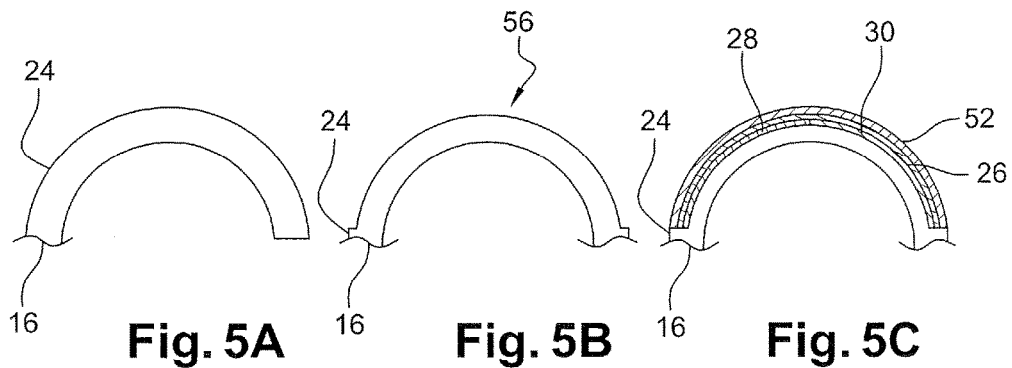
FIGS. 5A to 5C are simplified cross-section views of a half-shell of a tennis ball illustrating the integration of a piezoelectric system according to an embodiment of the invention on the external surface of the half-shell.

According to a first variation of the third embodiment, the piezoelectric system(s) are fastened to the rubber shell of the ball without for the latter to be submitted to a mass removal. According to a second variation of the third embodiment, illustrated in FIGS. 5A to 5C, each half-shell (FIG. 5A) receiving a band-shaped piezoelectric system, with or without holding band, undergoes a mass removal from outer surface 24 at the dimensions of the functional band (FIG. 5B) and the band is housed in the recess thus formed (FIG. 5C). In addition to maintaining the mass of the ball according to the invention within the required mass range, this enables to homogeneously planarize the external surface of the shell so that there is no apparent roughness due to additions of elements thereon.

Figures 6A, 6B, 6C:
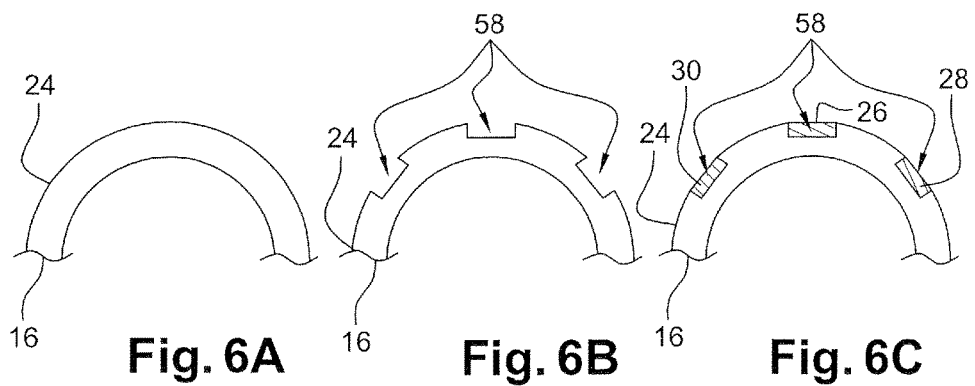
FIGS. 6A to 6C are simplified cross-section views of a half-shell of a tennis ball illustrating the integration of a piezoelectric system according to another embodiment according to the invention on the external surface of the half-shell.

In a third variation, the elements of a piezoelectric system (membrane, power supply, electronic circuit) are integrated independently from one another on outer surface 24 of shell 16, as illustrated in FIGS. 6A to 6C. This especially enables to select elements of larger thickness but having a smaller surface area, to have more liberty as to the positioning of the elements relative to one another in the way of distributing the elements and in the way of homogenizing the ball mass.

The electric connections between the system elements are for example formed by means of cables or of light thin wires, preferably housed in trenches formed in rubber shell 16, The cables are preferably designed to absorb the ball deformations, the cables being for example designed in the form of coils. Advantageously, a mass removal 58 is performed on outer surface 24 of shell 16 for each element (FIG. 6B) and the elements are housed in their respective recesses (FIG. 6C), which avoids surface roughnesses. Of course, in FIGS. 6B and 6C, the recesses and the elements have their dimensions exaggerated for illustration purposes, each of them having lower dimensions, each smaller than 10 mm.

According to a fourth embodiment, the piezoelectric system(s) are integrated in shell 16 of the tennis ball. The integration of one or a plurality of piezoelectric systems in the thickness of rubber shell 16 has the disadvantage of being more difficult to implement and to make a recycling impossible, but has the advantage of being the solution with the best mechanical robustness.

FIGS. 7A to 7E schematically illustrate an example of implementation of the fourth embodiment. First, the rubber half-shells are made thinner than conventionally (FIG. 7A). Then, the elements of a piezoelectric system, having equal or different surface areas, according to the desired weight balance, are integrated at the surface of each thinned half-shell, either in a single element with a common support in the form of a band such as previously described (FIG. 7B), or individually, similarly to FIG. 6. An encapsulation of rubber is then performed, for example either by gluing or by hot pressing, within the limit of the heat resistance of the technological components (FIG. 7C). As a variation, the rubber of the tennis ball is a hybrid rubber made of a natural or synthetic rubber having a material of controllable viscosity mixed thereto, which allows a rigid encapsulation and the mechanical protection of the piezoelectric system. The two half-shells are then conventionally glued (FIG. 7D) and the felt is finally added, also conventionally (FIG. 7E).

Specific embodiments of a piezoelectric system, particularly in the form of independent elements or bands, have been described. As a variation, the piezoelectric membrane, the electric power source, and the electronic circuit are stacked on one another, the electric power source being arranged between the piezoelectric membrane and the electronic circuit.

Further, the piezoelectric system may all be duplicated once or a plurality of times on the walls or in the shell, and this, for each of the four above-described embodiments, and as schematically illustrated in FIGS. 8A to 8C for piezoelectric systems formed in a stack.

Optionally, a piezoelectric system comprises an additional electric power supply, for example, a button cell, to power the electronic circuit.

According to another embodiment, the power source is not rechargeable, the piezo-electric membrane generating an electric signal under the effect of its mechanical deformation used for processing purposes only and/or as a trigger of the sending of data via the wireless transmitter or of the storage into the electronic circuit memory. The conversion circuit is then advantageously omitted.

A tennis ball has been described. Of course, the invention applies to any type of balls, and generally to any object having a deformable shell.

Applications to sport have been described. Of course, the invention applies to other types of activity, particularly physical rehabilitation activities which use balls or the like, the statistics generated by such objects according to the invention enabling the medical staff to study, for example, the quality of the exercises followed by the patients.

The invention claimed is:

1. A device comprising:
a deformable shell defining an inner space and comprising at least one piezoelectric system;
wherein said at least one piezoelectric system comprises
a flexible piezoelectric membrane capable of generating electric energy under the effect of a deformation to which it is submitted,
an electric power source formed on a flexible substrate, and
an electronic circuit, wherein the electronic circuit comprises
a processing circuit for generating and storing data according to the electric energy generated by the piezoelectric membrane, and connected to the electric power source for its electric power supply, and
a wireless transmitter connected to the processing circuit to transmit the data stored therein and connected to the electric power source for its electric power supply;
wherein in the device, each of the at least one piezoelectric system is totally arranged on and/or inside of the deformable shell; and
wherein the piezoelectric membrane, the electric power source and the electronic circuit are stacked on one another, and the electric power source is arranged between the piezoelectric membrane and the electronic circuit.

2. The device of claim 1, wherein the piezoelectric system is band-shaped, said band being secured to the outer surface of the deformable shell or secured to the inner surface of the deformable shell or housed in the deformable shell.

3. The device of claim 2, wherein the band is substantially homogeneous by weight lengthwise and widthwise.

4. The device of claim 2, wherein the band is fastened to a holding band glued on a wall of the deformable shell, said holding band being detachable.

5. The device of claim 2, wherein the electric power source and the electronic circuit are each arranged on the piezoelectric membrane.

6. The device of claim 5, wherein the electric power source and the electronic circuit substantially exactly cover the piezoelectric membrane.

7. The device of claim 5, wherein the thickness of the electric power source and the thickness of the electronic circuit are substantially equal.

8. The device of foregoing claim 1, comprising a plurality of identical piezoelectric systems.

9. The device of claim 8, wherein the shell exhibits at least one symmetry, and wherein the piezoelectric systems are distributed inside of and/or on the shell in accordance with the symmetry thereof.

10. The device of claim 1, wherein the electric power source is rechargeable, and wherein the electronic circuit comprises a conversion circuit connected to the piezoelectric membrane to convert the electric energy generated by said membrane into electric energy capable of being used to recharge the electric power source, and connected to the electric power source to recharge it with the converted electric energy.

11. The device of claim 1, wherein the wireless transmitter is a radio frequency transmitter.

12. The device of claim 1, wherein the shell is a tennis ball comprising a rubber shell, each piezoelectric system being totally arranged inside of and/or on the rubber shell.

* * * * *